United States Patent [19]

Eguchi et al.

[11] Patent Number: 5,329,514
[45] Date of Patent: Jul. 12, 1994

[54] INFORMATION PROCESSING APPARATUS, AND ELECTRODE SUBSTRATE AND INFORMATION RECORDING MEDIUM USED IN THE APPARATUS

[75] Inventors: Ken Eguchi; Haruki Kawada, both of Yokohama; Kiyoshi Takimoto, Isehara; Toshihiko Takeda, Atsugi, all of Japan

[73] Assignee: Canon Kabushiki Kaisha, Tokyo, Japan

[21] Appl. No.: 919,273

[22] Filed: Jul. 27, 1992

[30] Foreign Application Priority Data

Jul. 31, 1991 [JP] Japan ................................. 3-213054
Jul. 31, 1991 [JP] Japan ................................. 3-213055

[51] Int. Cl.$^5$ ............................................... H04N 1/21
[52] U.S. Cl. ................................. 369/126; 369/275.1; 250/306
[58] Field of Search ........................ 369/275.1-275.4, 369/126; 250/306; 346/135.1

[56] References Cited

U.S. PATENT DOCUMENTS

| 4,575,822 | 3/1986 | Quate | 365/174 |
| 4,868,396 | 9/1989 | Lindsay et al. | 250/440.1 |
| 5,206,665 | 4/1993 | Kawade et al. | 346/135.1 |

FOREIGN PATENT DOCUMENTS

| 0275881 | 8/1988 | European Pat. Off. | G11B 9/10 |
| 0397073 | 11/1990 | European Pat. Off. | H05K 3/10 |
| 61-80536 | 4/1986 | Japan . | |
| 63-161552 | 7/1988 | Japan . | |
| 63-161553 | 7/1988 | Japan . | |

OTHER PUBLICATIONS

G. Binning et al., "Surface Studies by Scanning Tunneling Microscopy," *Physical Review Letters*, vol. 49, No., Jul. 5, 1982, pp. 57-60.

H. J. Mamin et al., "Atomic Emission from a Gold Scanning-Tunneling-Microscope Tip," *Physical Review Letters*, vol. 65, No. 19, Nov. 5, 1990, pp. 2418-2421.

Primary Examiner—Paul M. Dzierzynski
Assistant Examiner—Don Wong
Attorney, Agent, or Firm—Fitzpatrick, Cella, Harper & Scinto

[57] ABSTRACT

An electrode substrate includes a substrate and an electrode layer of a noble metal crystal formed on the substrate, the noble metal crystal exhibiting a substantially linear domain boundary and a plane orientation dispersion angle in X-ray analysis of 1° or less. An information recording medium includes an electrode substrate as described above and a recording layer provided on the electrode layer. An information processing apparatus includes: an information recording medium as described above; a probe electrode arranged in close proximity to this medium; and a voltage applying circuit for applying a pulse/bias voltage between the medium and the probe electrode, information being written/read onto/from the medium by the application of the pulse/bias voltage. An information processing method includes the steps of: preparing an information recording medium as described above; arranging a probe electrode in close proximity to the medium; and applying a pulse/bias voltage between the medium and the probe electrode so as to write/read information onto/from the medium.

32 Claims, 10 Drawing Sheets

INFORMATION PROCESSING APPARATUS, AND ELECTRODE SUBSTRATE AND INFORMATION RECORDING MEDIUM USED IN THE APPARATUS

BACKGROUND OF THE INVENTION

1. Field of the Invention

The present invention relates to an information processing apparatus utilizing the principle of a scanning tunneling microscope (hereinafter abbreviated as "STM"), and an electrode substrate and an information recording medium used in the apparatus.

2. Description of the Related Art

Nowadays, memory materials are being used in computers and apparatuses related thereto, video discs, digital audio discs, etc., equipment constituting the nucleus of the electronics industry. The development of new materials in this field is being very actively promoted. The characteristics required of memory material vary in accordance with the use for which it is intended. The following are characteristics generally required of memory material:

① High density and large recording capacity;
② High response speed in recording and reproduction;
③ Low power consumption; and
④ High productivity and low price.

Conventionally, semiconductor memories and magnetic memories made of semiconductors and magnetic substances have been the mainstream of memories for information processing. However, as a result of recent developments in laser technology, inexpensive high-density recording mediums have appeared which consist of optical memories using films of organic dyes, photopolymers, or the like.

Apart from this, an STM (a scanning tunneling microscope) has recently been developed which makes it possible to directly observe the electronic structure of a surface atom of a conductor (G. Binning et al., *Phys. Rev. Let.*, 49,57 (1982)). With this microscope, it is possible to perform high-resolution measurement on a real image in space, whether it is monocrystalline or amorphous. Further, it has an advantage that it allows the specimen to be observed with low power without being damaged by electric current. Moreover, it can operate even in ambient atmosphere so that it can be used with respect to various types of materials. Thus, a wide range of applications are expected from the STM.

The STM utilizes the fact that a tunnel current flows when a metal probe (a probe electrode) is brought near a conductive substance, up to a distance of approximately 1 nm, while applying a voltage between them. This current is very sensitive to changes in the distance between the metal probe and the conductive substance, and even allows for the reading of a variety of information regarding the entire electron cloud in an actual space by performing scanning with the probe in such a way as to maintain the tunnel current constant. In that case, the resolution in the in-plane dimension is approximately 0.1 nm.

Thus, by utilizing the principle of the STM, there is a good possibility that a high-density recording/reproduction of the atom order (sub-nanometer) can be performed. For example, in the information processing apparatus disclosed in Japanese Patent Laid-Open Publication No. 61-80536, an electron beam or the like is used to write data onto a recording medium by removing atom particles adhering to the medium surface, and reproducing the data by means of an STM. According to the disclosure in the specification of U.S. Pat. No. 4,575,822, the tunnel current flowing between the recording medium surface and the probe electrode is used to effect recording by injecting electric charges into a dielectric layer formed on the medium surface. There has also been a method proposed in which a laser beam, electron beam, corpuscular beam or the like is used to perform recording by utilizing physical or magnetic disruption of the medium surface.

According to another proposed method, a material having a memory effect with respect to voltage/current switching characteristics, for example, a thin-film layer of a $\pi$-electron-type organic compound, chalcogen compound or the like, is used as the recording layer to perform recording and reproduction with an STM (Japanese Patent Laid-Open Publication Nos. 63-161552 and 63-161553). Assuming that the recording bit size is 10 nm, this method makes it possible to perform recording and reproduction by as much as $10^{12}$bit/cm$^2$.

FIG. 8 shows a sectional view of a conventional recording medium together with the tip of a probe electrode 202.

Numeral 101 indicates a substrate; numeral 102, an electrode layer; numeral 103, a recording layer; numeral 104, a track; numeral 202, the probe electrode; numeral 401, a data bit recorded on the recording layer 103; and numeral 402, crystal grains generated during the formation of the electrode layer 102. Assuming that the electrode layer 102 is formed by a usual method, such as vacuum evaporation or sputtering, the size of the crystal grains 402 ranges from approximately 30 to 50 nm.

The distance between the probe electrode 202 and the recording layer 103 can be kept constant through a conventionally well-known circuit construction. That is, a tunnel current flowing between the probe electrode and the recording layer is detected, and its value is transmitted through a logarithmic compressor 302 and a low-pass filter 303 and then compared with a reference voltage. A Z-axis actuator 204 supporting the probe electrode is controlled in such a way that this comparison value approaches zero, thereby maintaining a constant distance between the probe electrode and the recording layer.

Further, by driving an XY-stage 201, the surface of the recording medium is traced by the probe electrode 202, and the high frequency component of a signal at an arbitrary point P is separated, thereby making it possible to detect the data of the recording layer 103. FIG. 9 shows a signal strength spectrum with respect to the signal frequency at point P at this time.

Any signals of a frequency component not higher than $f_0$ are due to a gentle rise and fall of the substrate 101 caused by warp, distortion or the like. The signals around $f_1$ are due to surface irregularities of the electrode layer 103, caused mainly by the crystal grains 402 generated during the formation of the material into an electrode. Symbol $f_2$ indicates a recording data carrier component, and numeral 403 indicates a data signal band as shown in FIG. 6. Symbol $f_3$ indicates a signal component generated from the atomic/molecular arrangement of the recording layer 103. Symbol $f_T$ indicates a tracking signal, which enables the probe electrode 202 to trace data arrays. It can be realized by forming a groove on the medium or writing thereto a signal which enables detection whenever an off-track condition occurs.

Use of a conventional recording medium based on an electrode substrate as described above entails the following problems:

① To make use of the high resolution, which features the STM, and perform high-density recording, the data frequency component 403 must be between $f_1$ and $f_3$. For this purpose, a high-pass filter of a cut-off frequency of $f_c$ is used for data component separation. However, as shown in FIG. 9, a foot portion of the $f_1$ signal component overlaps the data band 403. This is attributable to the fact that the $f_1$ signal component is due to the crystal grains 402 of the electrode layer 102, with the recording size and bit interval of the data being in the range of 1 to 10 nm, which is close to the crystal grain size of 30 to 50 nm. As a result, the S/N ratio in data reproduction is deteriorated, thereby increasing the incidence of error.

② The tracking signal $f_T$ can only be placed in the vicinity of $f_0$. As a result, the frequency of the tracking signal is considerably low as compared with the data frequency, resulting in poor data tracing accuracy in tracking. This causes the incidence of error in data reading to be increased, thereby deteriorating the reliability of the information processing apparatus.

③ Further, a track groove corresponding to such a low tracking frequency is considerably large as compared to the data bit size, with the result that the data recording density is significantly low, thereby making it impossible to fully make use of the high resolution featuring the STM.

SUMMARY OF THE INVENTION

The present invention has been made in view of the above problems in the prior art. It is an object of this invention to provide an electrode substrate and a recording medium which help to realize an unprecedentedly high density in recording, and high S/N ratio and high-speed reading in information reproduction, as well as an information processing apparatus using them.

In accordance with a first aspect of the present invention, an electrode substrate is provided comprising a substrate and an electrode layer of a noble metal crystal formed on the substrate, the noble metal crystal exhibiting a substantially linear domain boundary and a plane orientation dispersion angle in X-ray analysis of 1° or less.

In accordance with a second aspect of the present invention, an information recording medium is provided having an electrode layer according to the above first aspect, as a recording layer. In accordance with a third aspect of the present invention, an information recording medium is provided comprising a substrate, an electrode layer of a noble metal crystal formed on the substrate, and a recording layer provided on the electrode layer, the noble metal crystal exhibiting a substantially linear domain boundary and a plane orientation dispersion angle in X-ray analysis of 1° or less.

In accordance with another aspect of the present invention, an information processing apparatus comprising: an information recording medium according to the present invention as described above; a probe electrode arranged in close proximity to this medium; and a voltage applying circuit for applying a pulse voltage between the medium and the probe electrode, information being written onto the medium by the application of the pulse voltage;

an information processing apparatus comprising: an information recording medium according to the present invention as described above; a probe electrode arranged in close proximity to this medium; a first voltage applying circuit for applying a pulse voltage between the medium and the probe electrode, and a second voltage applying circuit for applying a bias voltage between the medium and the probe electrode, information being written onto the medium by the application of the pulse voltage and read from the medium by the application of the bias voltage; and an information processing apparatus comprising: an information recording medium according to the present invention as described above; a probe electrode arranged in close proximity to this medium; and a voltage applying circuit for applying a bias voltage between the medium and the probe electrode, information being read from the medium by the application of the bias voltage are provided.

In accordance with a further aspect of the present invention, an information processing method comprising the steps of: preparing an information recording medium according to the present invention as described above; arranging a probe electrode in close proximity to the medium; and applying a pulse voltage between the medium and the probe electrode so as to write information onto the medium;

an information processing method comprising the steps of: preparing an information recording medium according to the present invention as described above; arranging a probe electrode in close proximity to the medium; applying a pulse voltage between the medium and the probe electrode so as to write information onto the medium; and applying a bias voltage between the medium and the probe electrode so as to read the information from the medium; and an information processing method comprising the steps of: preparing an information recording medium according to the present invention as described above; arranging a probe electrode in close proximity to the medium; and applying a bias voltage between the medium and the probe electrode so as to read information from the medium are provided.

DETAILED DESCRIPTION OF THE PREFERRED EMBODIMENTS

In the present invention, the noble metal crystal of the electrode substrate is preferably a planar crystal forming a (111) plane orientation facet. Further, it is desirable that the noble metal crystal be one grown from a conductive substrate through a hole provided in an insulating layer formed on the conductive substrate.

Further, in the electrode substrate of the present invention, the plane orientation dispersion angle of the planar crystal surface is preferably 0.6° or less, the aspect ratio of the noble metal crystal is 10 or more, and the maximum surface irregularity in a 10 μm square (i.e., a square area of 10 μm×10 μm) is 1 nm or less. Further, in the information recording medium (hereinafter referred to simply as "recording medium") of the present invention, it is desirable that the maximum surface irregularity in a 10 μm be 1 nm or less and information be recorded by changes in the physical conditions of the recording layer, with the recording layer having an "electrical memory" effect. Further, it is desirable that the recording medium have a track, the recording layer consisting of a monomolecular film of an organic compound or a built-up film thereof, and the recording layer having an thickness ranging from 5 to 300Å, allowing repeated recording and erasing. Further, it is desirable that the recording layer be formed by the Langmuir-Blodgett's technique.

In the present invention, the term "electrical memory effect" means the following phenomenon:

"When a thin film made of an organic compound is arranged between a pair of electrodes and a voltage beyond a threshold is applied to the electrodes, a transition takes place from a first to a second physical condition, the first or the second physical condition being maintained as long as no voltage beyond the threshold is applied to the electrodes."

Figure 11:
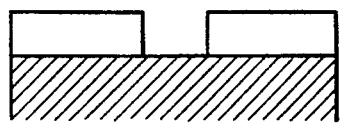
FIGS. 11(a) to 11(c) are sectional views of seed substrates used in embodiments of the present invention.
Figure 11:
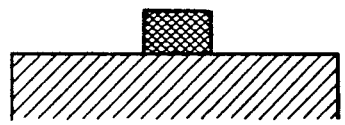
Figure 11:

Further, in the method of producing an electrode substrate according to the present invention, it is desirable that a structure be formed on the substrate surface which constitutes a seed for normal metal crystallization, as can be seen in the sectional view of seed substrates in FIGS. 11(a) to 11(c).

Still further, apart from using the above preferable electrode substrate or recording medium, it is desirable, in a preferred form of the information processing apparatus of the present invention, that the probe electrode have the same pattern as the specifiable pattern of the electrode substrate of the recording medium, and that the probe electrode be of a multi-probe type.

The present invention provides a substrate electrode having a smooth surface so as to make it possible to fully make use of the function of an information processing apparatus utilizing the principle of the STM.

The present invention will now be described in detail with reference to the drawings.

Figure 1:
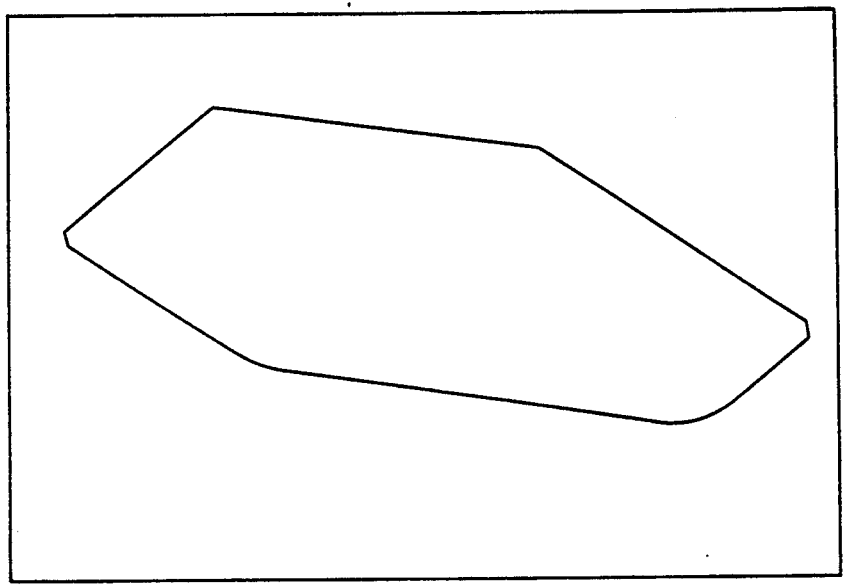
FIG. 1 shows an optical microscope image of an electrode substrate consisting of a planar gold crystal formed on a silicon substrate by the production method of the present invention.
Figure 2:
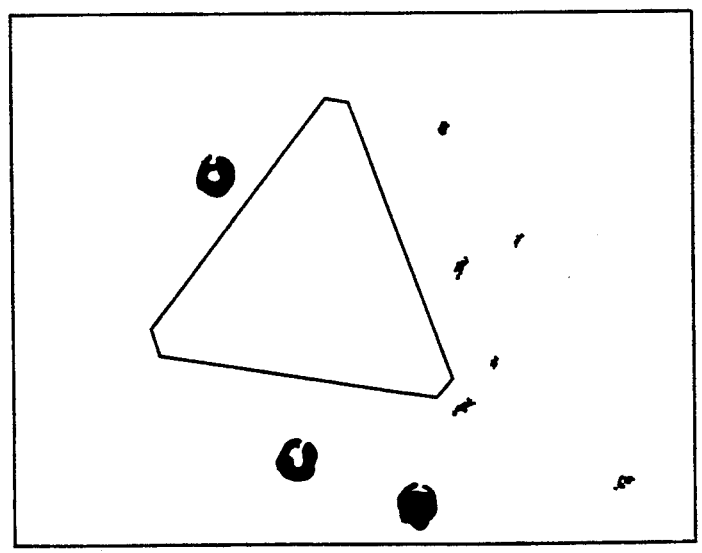
FIG. 2 shows an optical microscope image of an ordinary gold crystal.
Figure 3:
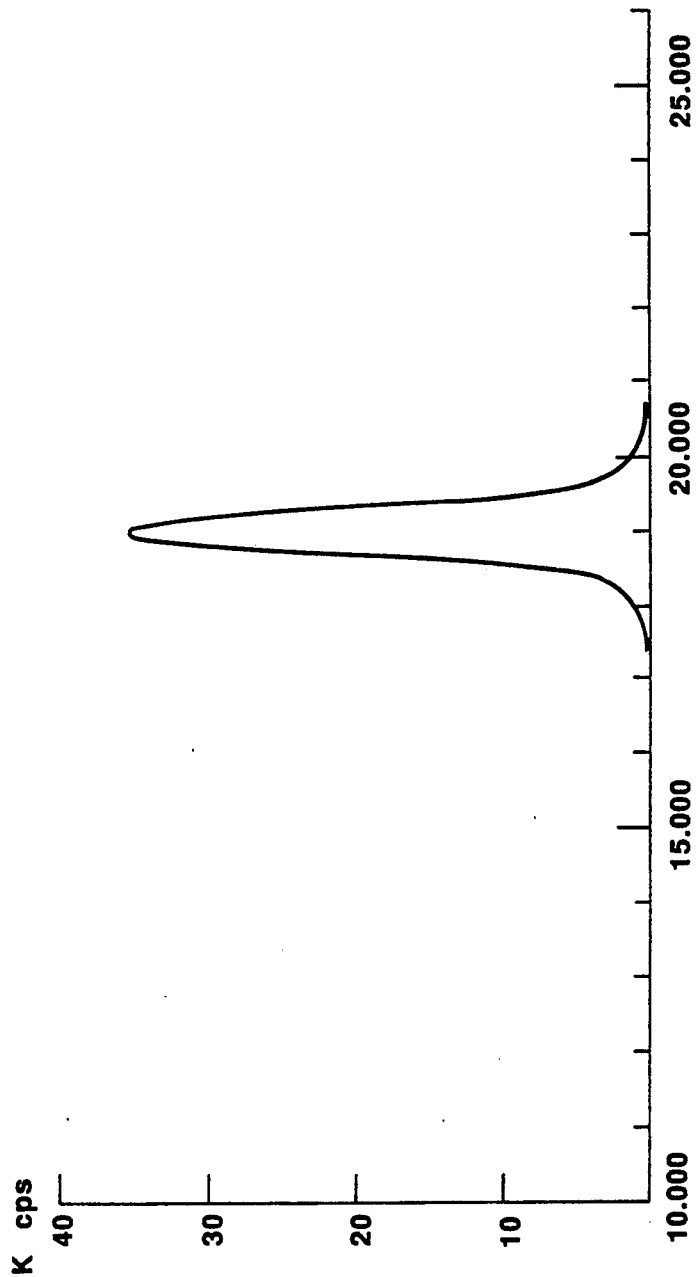
FIG. 3 shows a small-angle X-ray diffraction spectrum of an electrode substrate according to the present invention.
Figure 12:
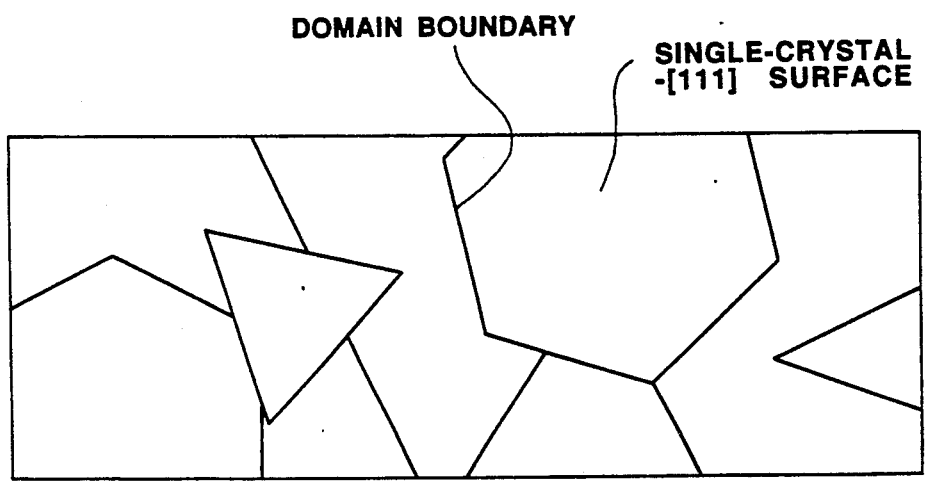
FIG. 12 is a plan view (a schematic view) of an essential part of the surface of an electrode prepared in accordance with an embodiment of the present invention.

FIG. 1 shows an optical microscope image of a planar gold crystal formed on a Si crystal substrate by the electrode substrate producing method of the present invention. While the gold crystal shown in FIG. 1 substantially exhibits a regular-hexagonal planar configuration, there is also generally to be observed a planar crystal having a threefold-symmetry axis (FIG. 2), or an unsymmetrical deformed crystal out of the configuration of FIG. 2. However, in the present invention, the gold crystal clearly forms a facet surface corresponding to each crystal surface, as shown in FIG. 1, and it has been confirmed through an electron channeling pattern measurement by SEM that the planar surface of the gold crystal exhibits a (111) orientation and is substantially free from any defects. Further, from the X-ray diffraction data shown in FIG. 3 (measured by the X-ray diffraction apparatus RAD3B manufactured by Rigaku Denki), the dispersion angle of the surface of a crystal gold electrode substrate made of a planar crystal exhibited a (111) plane orientation dispersion angle of 0.9°. Thus, an electrode substrate of a very high level of orientation could be obtained. Under a more preferable condition, an electrode substrate exhibiting a plane orientation dispersion angle of 0.6 or less can be obtained. Further, with a polycrystalline gold electrode substrate, it is possible to obtain an electrode substrate of a high level of orientation with respect to various substrate materials. The crystal domain boundary is formed substantially linear (FIG. 12), and the dispersion angle in (111) orientation is small, making it possible to obtain an electrode substrate having a dispersion angle of 1° or less. Also, the ratio of the maximum diameter of the (111) surface to the height of the planar crystal, i.e., the aspect ratio, of the gold crystal is approximately 30. Generally speaking, a gold crystal having an aspect ratio of 10 or more can be easily obtained, which is preferably used in the present invention. Under a still more preferable condition, a crystal having an aspect ratio of 100 or more can be obtained.

The above planar gold substrate can be formed by the following processes: First, $I_2$ is dissolved in an oxidizing solution having the property to dissolve gold, for example, a KI aqueous solution, in order to obtain an iodine solution in which gold is dissolved to obtain a gold-complex aqueous solution (in which gold is dissolved as a complex having a structure of $(AuI_4)^-$). A substrate is immersed in this gold-complex aqueous solution, and, to reduce the insolubility of the gold, the $I_2$ is removed from the reaction system by evaporating the same by heating or reducing the $I_2$ to $I^-$ by using a reducing agent, and the gold complex is disintegrated by heating or the like to cause it to crystallize on the surface of the substrate. When the rate of crystallization is high, a grain-cluster-like polycrystal will be generated. In view of this, the planar gold crystal is grown by an oxidizing dissolution reaction while balancing the etching rate with the disintegration rate of the complex. This process suggests a similarity to a vapor-phase epitaxial growth.

Figure 4:
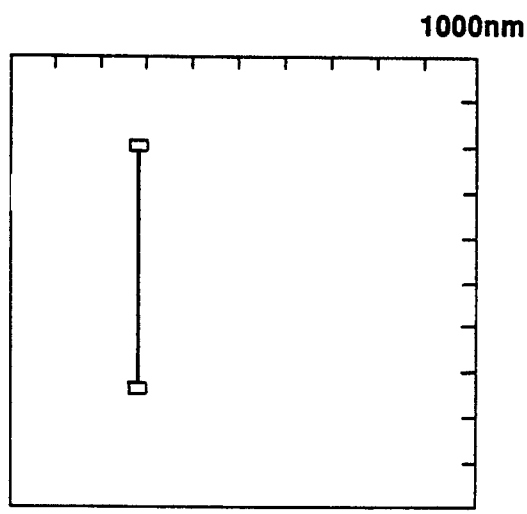
FIGS. 4(a) and 4(b) are an STM image and a surface irregularity profile in the Z-axis direction of the surface of an electrode substrate according to the present invention.
Figure 4:
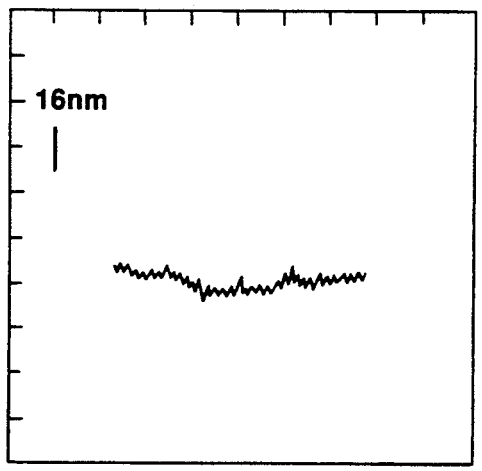

FIG. 4 shows an STM image of a (111) surface grown in the manner described above. As shown in the STM image of a 1 μm square (i.e., a square area of 1 μm×1 μm) in the (111) surface of FIG. 4 (a), it may be considered that a substantially flat smooth electrode substrate has been realized in a 1 μm square area by using the gold crystal. As shown in the irregularity profile in the Z-axis direction of FIG. 4(b), its surface irregularities consist of atomic-step-like long-period steps of 1 nm or less. With this planar gold electrode, it is possible to provide an electrode substrate having a still higher level of smoothness. That is, it is possible to provide an electrode substrate in which the difference between the highest crest and the deepest recess (the maximum surface irregularity) in a 10 μm square is 1 nm or less and the peak value of irregularity dispersion (the dispersion peak) from the average value of surface irregularity is 0.5 nm or less.

The size of the planar gold crystal under the normal condition ranges from 1 μm square to 1 mm square. Under optimum conditions, it is possible to obtain a crystal having a size of 10 mm square or less, that is, several mm square. However, it is also possible for a crystal having a large size of 10 mm square or more to be separated, which is controllable, though difficult. Further, it is also possible to prepare an electrode substrate by continuously forming minute planar crystals. Also, with such an electrode substrate it is possible to obtain an electrode substrate in which the (111) plane orientation dispersion angle is smaller than that of a substrate formed by a usual vacuum film formation method, thus making it possible to form an electrode having an excellent orientation property.

Further, in the above production method, any material can be used for the substrate material as long as it does not cause a serious corrosion in the gold-complex solution. Examples of the substrate material that can be used include: insulating materials such as mica, MgO, $SiO_2$, and $Si_3N_4$; organic high-molecular weight materials; Si substrates (crystalline or amorphous), which are conductive materials; graphite (HOPG); and various metal substrates and substrates of compounds thereof.

However, a difference was observed in the ease with which the gold crystal was separated depending upon the type of substrate used. By utilizing such a difference in gold-crystal separation characteristics between different types of substrates, it is possible to selectively generate and grow the planar gold substrate at desired positions.

Further, although the characteristics of the planar crystal and the production method thereof have been described with reference to the case where gold is adopted as the material, the planar crystal to be grown is not restricted to a gold crystal. A similar technique is also applicable to noble metal materials allowing the formation of a complex halide, such as Pt, Pd, Rh, and Ir. Further, it is also applicable to a complex cyanide and a complex sulfite.

Figure 5:
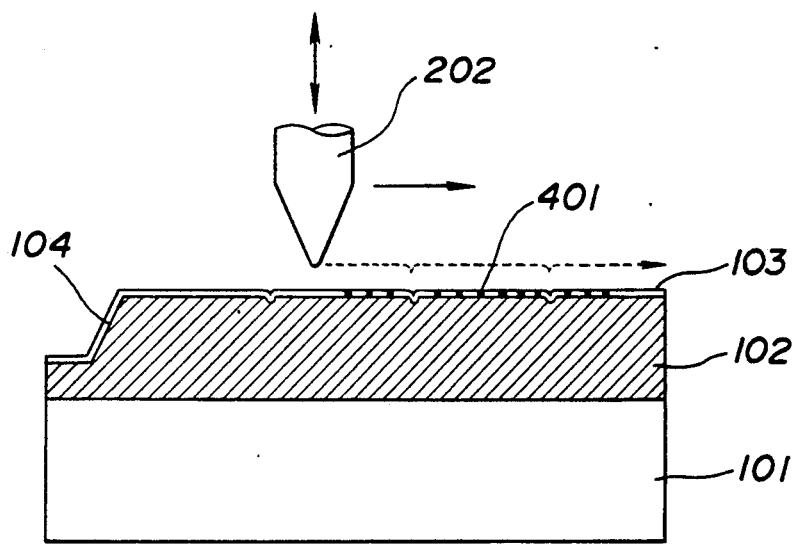
FIG. 5 is a sectional view of a recording medium according to the present invention.

FIG. 5 is a sectional view of a recording medium using an electrode substrate according to the present invention. Numeral 101 indicates a substrate; numeral 102, an electrode layer having a smooth surface; numeral 103, a recording layer; numeral 104, a track; numeral 202, a probe electrode; and numeral 401, a data bit.

Figure 10:
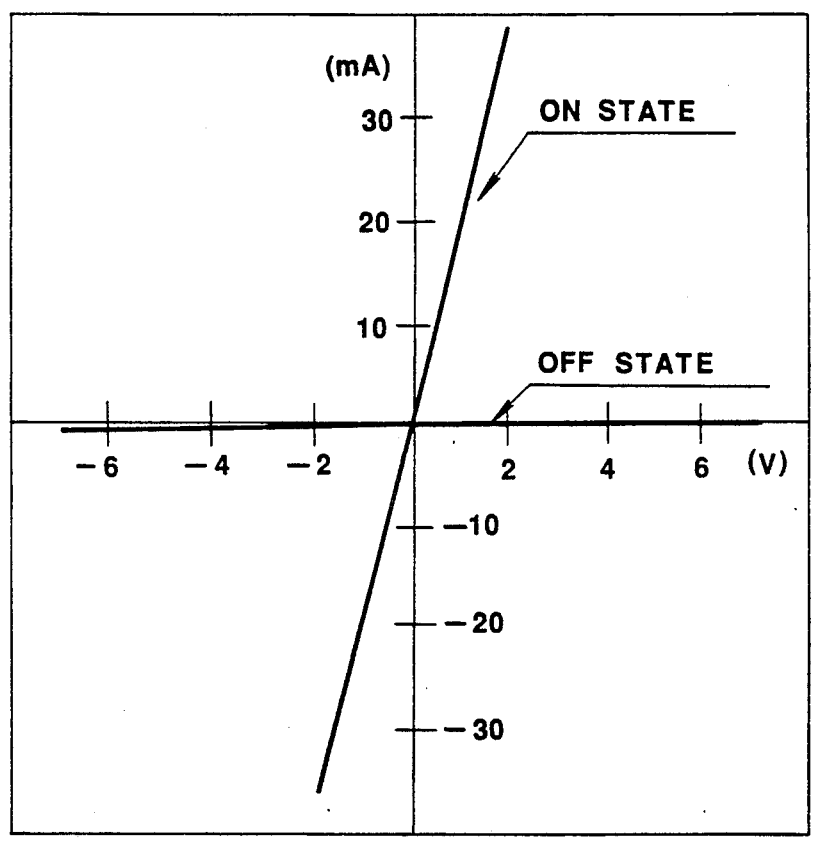
FIG. 10 is a current-voltage characteristic graph according to the present invention.

The recording layer may be formed of a material capable of developing a memory-switching phenomenon (an electrical memory effect) having current-voltage characteristics, as for example, an organic monomolecular film or a built-up film thereof, having molecules each including both a group having a $\pi$ electron level and a group having a $\sigma$ electron level deposited only on the electrode. Due to the electrical memory effect, it is possible to reversibly effect transition (switching) between a low-resistance condition (ON condition) and a high-resistance condition (OFF condition) (the ON and OFF conditions in FIG. 10) by applying a voltage beyond a threshold which enables transition, with an organic molecular film as described above, a built-up film thereof, or the like, being arranged between a pair of electrodes. Further, each of the conditions can be maintained (stored in memory) without applying any voltage.

Generally speaking, most organic materials exhibit an insulating or semi-insulating property. Thus, the organic materials that can be applied to the present invention, which contain a group having a πelectron level, include an extremely wide range. Examples of a dye having a $\pi$ electron system which is suitable for the present invention, include: dyes having a porphyrin skeleton, such as phthalocyanine and tetraphenylporphyrin; azulene-type dyes having a squalilium group and a croconic methine group as a bonding chain; dyes similar to a cyanine type or cyanine dyes in which two nitrogen-containing complex rings, such as quinoline, benzothiazole, or benzooxazole, are connected by a squalilium group and a croconic methine group; condensed polycyclic aromatic compounds, such as anthracene and pyrene; chain compounds formed by polymerization of an aromatic cyclic compound or a complex cyclic compound; a polymer of a diacetylene group; a derivative of tetracyanoquinodimethane or tetrathiafulvalene and an analog thereof or a charge-transfer complex thereof; and a metal complex compound such as ferrocene and trisbipyridine ruthenium. Further, examples of a polymer material suitable for the present invention include a condensation polymer of polyimide, polyamide or the like, and biopolymers such as protein.

The electrical memory effect of these compounds having a $\pi$ electron level has been observed on examples having a film thickness of several tens of nm or less. From the viewpoint of film formation characteristic and uniformity, a preferable film thickness is in the range of 5 to 300 Å.

In another form of the present invention, the recording layer 103 is not absolutely necessary. As stated in *Phys. Rev. Lett.*, 65, 2418 (1990) by H. J. Mamin et al., it is possible to directly cause a perturbation on the surface of the electrode layer 102 so as to selectively generate a disturbance thereon, for example, by depositing fine gold particles on the electrode surface through field evaporation of gold by using a gold probe electrode. According to the above reference, this field evaporation of gold varies somewhat depending upon the distance between the electrode surface and the tip of the probe electrode. With an application voltage of 3.2V or less, the probability that the field evaporation of gold will take place is zero. However, when a voltage of 3.5V to 4V is applied, the probability that the field evaporation of gold occurs is 100%. The pulse width which allows recording at this time is 1 μm or less, making it possible to cope with high-speed recording. The pit diameter varies depending upon various conditions. Usually, recording with a pit diameter of 100 to 300 Å is possible, and under more preferable conditions, recording can be effected with a pit diameter of 30 to 100 Å, and further, 30 to 70 Å. In the vacuum evaporation of a noble metal, a grain cluster of 300 to 500 Å is usually generated, so that it is rather difficult to clearly distinguish the recording from the surface irregularities on the electrode substrate. Therefore, in the present invention, use of a smooth electrode substrate according to the present invention is indispensable. The direction of the field evaporation largely depends upon the surface condition of the smooth substrate electrode, and the above-described phenomenon occurs regardless of the polarity of the application electrode. That is, by making the polarity on the side of the probe electrode positive, deposition of fine gold particles takes place on the substrate electrode surface, as described above. If, conversely, a positive application is effected on the substrate electrode side, the deposition of gold on the substrate electrode surface takes place in the same way, although the threshold voltage thereof increases. However, it is also possible to position the probe electrode on a minute gold protrusion on the substrate electrode surface and remove the gold protrusion by applying a voltage (erasable).

Although methods of directly imparting a perturbation to the electrode layer have been described, it is also possible, as shown in FIG. 5, to provide the recording layer 103 on a smooth electrode surface and selectively cause changes in the conditions of the recording layer, including changes in the configuration thereof, thereby effecting recording. Regarding the material to be employed for the recording layer, it is possible to use an organic compound which allows changes in configuration to take place through irradiation of various types of energy at low levels as described below. Further, by effecting recording through changes in the condition of individual organic molecules, it is possible to obtain a recording density on a molecular scale.

1) A method of effecting local changes in the structure and orientation of a molecular aggregate formed on the recording layer.

For example, a change is caused in the physical structure of an LB film by using a local current and an ion current generated through a probe current or an electric field effect, thereby causing a local variation in the film thickness of the LB film so as to effect recording. As described below, to obtain an organic thin film having a high level of orientation, a method using an LB film is the optimum one known at present.

Further, as a recording method of this type, a method is available according to which changes in the orientation of a liquid crystal material under an electric field are utilized.

2) A method of causing local changes in the molecular or electronic structure of the recording layer using the above local current and ion current generated through a probe current or an electric field effect.

Further, it is possible to cause changes in the film structure as a result of a local oxidation-reduction reaction, thereby effecting recording.

3) A method of causing changes in an electron condition accompanying a local polymerization by using the above local current and ion current generated through a probe current or an electric field effect.

A monomer used in the method may be:

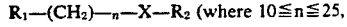

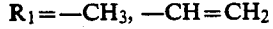

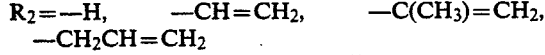

$R_1$—$(CH_2)$—$_n$—$X$—$R_2$ (where $10 \leqq n \leqq 25$, $X = $ —COO—, —CONH—, —OCO—
$R_1 = $ —CH$_3$, —CH=CH$_2$
$R_2 = $ —H, —CH=CH$_2$, —C(CH$_3$)=CH$_2$, —CH$_2$CH=CH$_2$
($R_2$ is not —H when $R_1$ is —CH$_3$))

4) A method of directly effecting recording by virtue of changes in molecular conformation or molecular configuration using the above local current and ion current generated through a probe current or an electric field effect.

For example, the following compounds can be used in this method:

(A) a compound which is a derivative of spiropyran, fulgide, or azobenzene and which has a photochromic characteristic; and (B) a compound in which changes occur because of dye association, as for example, a melocyanine compound.

In the above-described methods, recording may be effected separately. Generally, however, it is often realized in the form of a combination of a number of effects.

Specifically, the formation of the recording layer 103 may be effected by evaporation, the cluster ion beam method or the like. However, from the viewpoint of controllability, facility and reproducibility, the LB method is the most suitable of the conventional methods known in the art. With the LB method, a monomolecular film of an organic compound having in one molecule a hydrophobic portion and a hydrophilic portion, or a built-up film thereof, can be easily formed on a substrate, thereby making it possible to stably provide an organic ultra-thin film which has a thickness of a molecular order and which is uniform and homogeneous over a wide area. Accordingly, it is possible to prepare a recording medium which reflects the surface property of an under-coat electrode substrate as it is.

In accordance with the LB method, a monomolecular film or a built-up film thereof is formed by utilizing the fact that in molecules each having a structure in which hydrophilic and hydrophobic portions exist therein, an appropriate balance is maintained between them, the molecules form a monomolecular layer on a water surface, with the hydrophilic groups facing downwards. Examples of the group constituting the hydrophobic portion include various types of hydrophobic groups, such as generally well-known saturated and unsaturated hydrocarbon groups, condensed polynuclear aromatic groups, and chain polycyclic phenyl groups. One, or a plurality of types of such groups, are combined to form the hydrophobic portion. Most typical examples of the group forming the hydrophilic portion include various types of hydrophilic groups, such as carboxyl group, ester group, acid amide group, imide group, hydroxyl group, and amino group (of first, second, third or fourth grade). One, or a plurality of types of such groups, are combined to form the above-mentioned hydrophilic portion.

With an organic molecule including such hydrophobic and hydrophilic groups in a well-balanced manner and having an appropriate size, it is possible to form a monomolecular film on the surface of water, thus providing a material which is very suitable for the present invention.

In the present invention, the tip of the probe electrode 202 must be as pointed as possible so that the resolution in recording and reproduction may be improved. It is generally known that a probe electrode having an atomic resolution can be prepared by an electrolytic polishing method, such as the tungsten method. However, in view of the problem of a surface oxide film or the like, it is possible to employ a probe electrode prepared by mechanically polishing the tip of a 10 thick platinum bar into a cone of 90° and evaporating the surface atoms through application of an electric field in an ultra-high vacuum. It is known that a probe electrode prepared in this way has an atomic resolution. However, the configuration and processing method of the probe electrode are not restricted to those described above.

Figure 6:
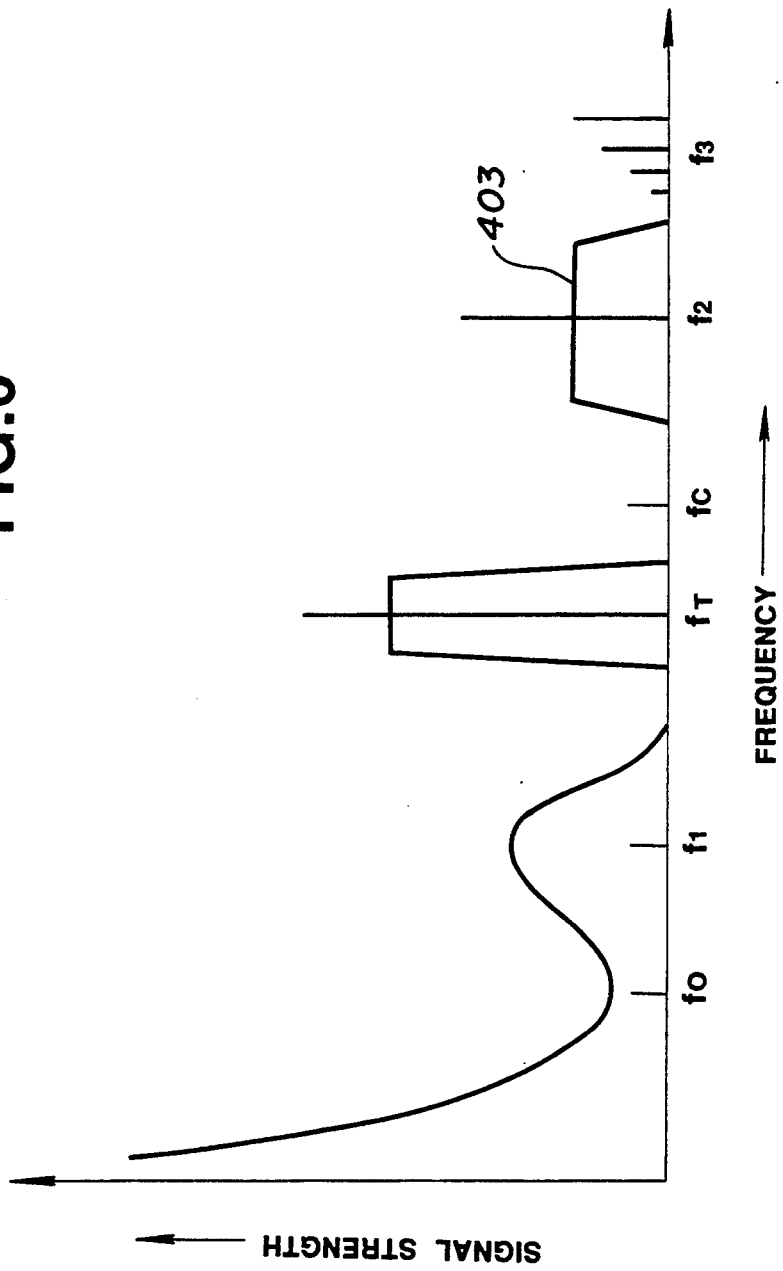
FIG. 6 is a diagram showing a frequency spectrum of a reproduction signal when a recording medium according to the present invention is used.
Figure 7:
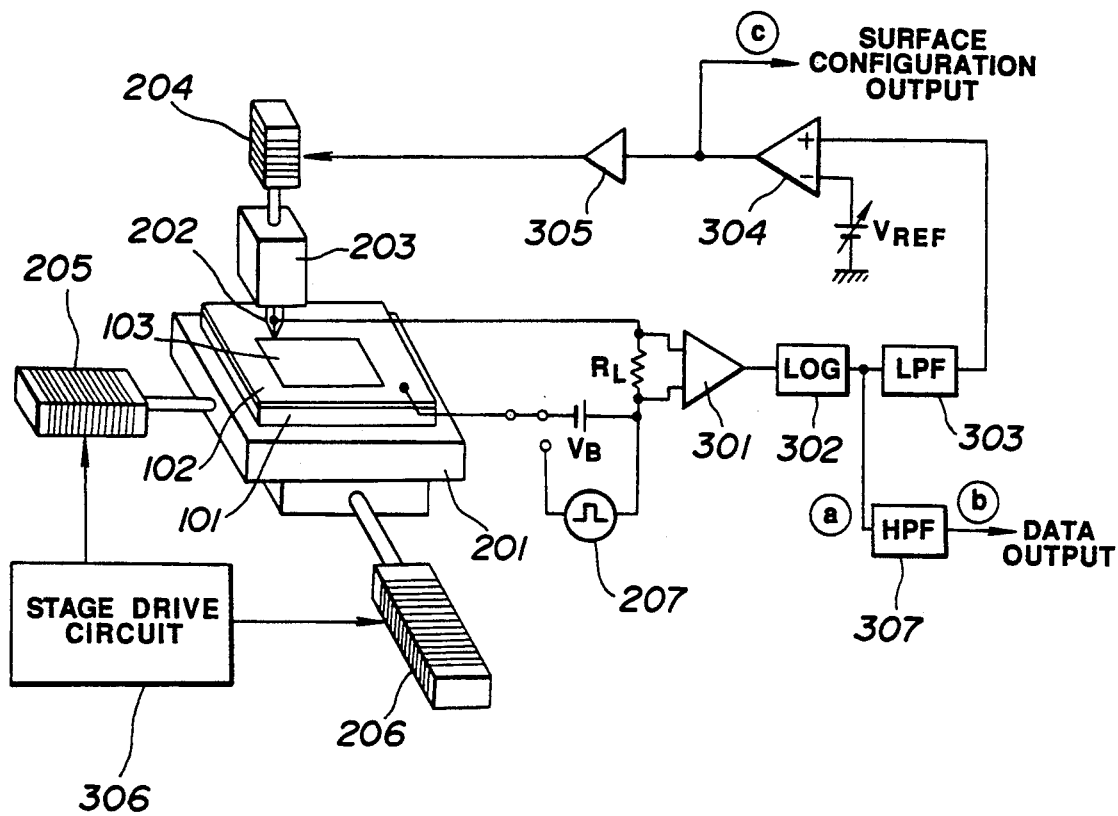
FIG. 7 is a diagram showing the construction of an information processing apparatus utilizing an STM.
Figure 8:
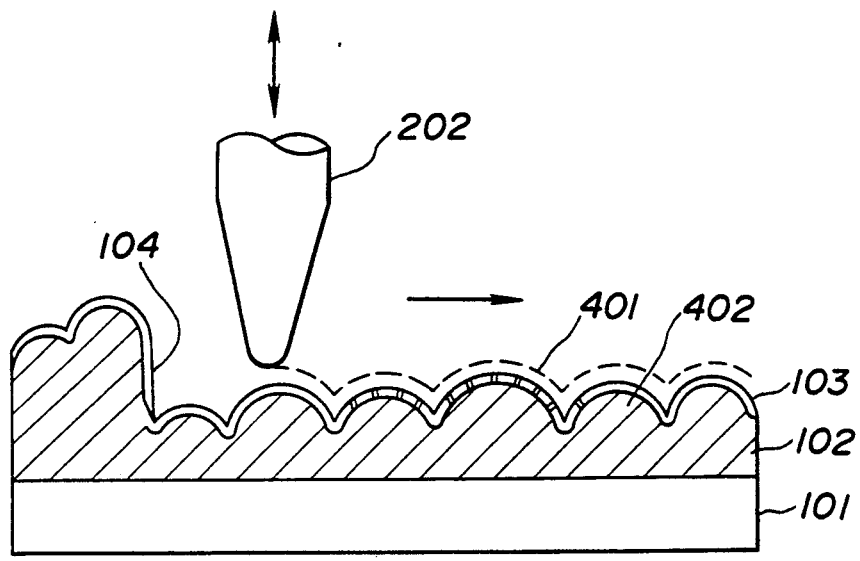
FIG. 8 is a sectional view of a conventional recording medium.
Figure 9:
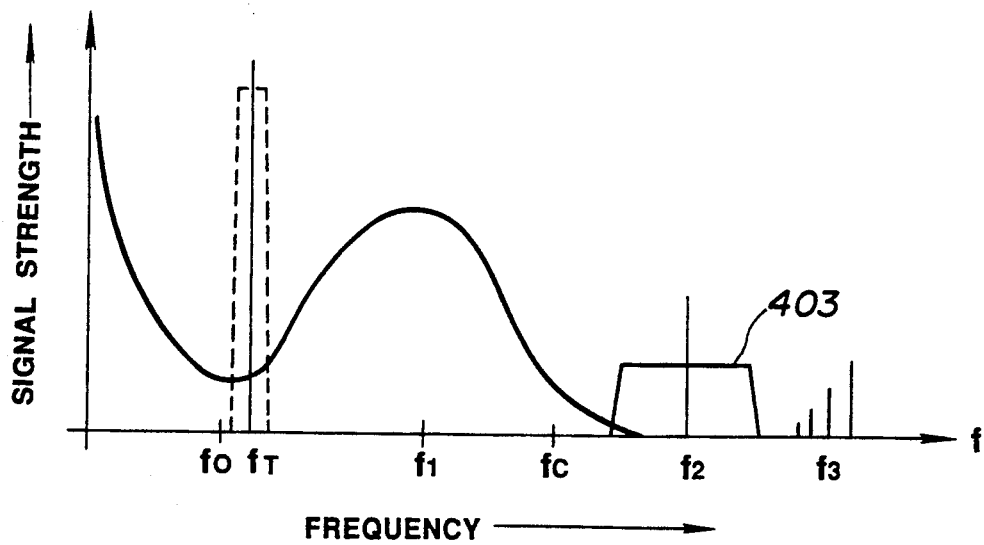
FIG. 9 is a diagram showing a frequency spectrum of a reproduction signal when a conventional recording medium is used.

FIG. 6 shows the signal frequency spectrum of a signal at point P in the information processing apparatus of the present invention shown in FIG. 7.

FIG. 7 shows an example of the construction of an information processing apparatus utilizing the principle of the STM, which will be described below with reference to the drawing. Numeral 101 indicates a substrate; numeral 102, a metal electrode layer; and numeral 103, a recording layer. Numeral 201 indicates an XY stage; numeral 202, a probe electrode; numeral 203, a support member for the probe electrode; numeral 204, a linear actuator for driving the probe electrode 204 in the Z-direction; numerals 205 and 206, linear actuators for driving the XY stage in the X- and Y-directions, respectively; and numeral 207, a pulse voltage circuit.

Numeral 301 indicates an amplifier for detecting a tunnel current flowing from the probe electrode to the electrode layer 102 by way of the recording layer 103. Numeral 302 indicates a logarithmic compressor for converting a change in the tunnel current into a value which is proportional to the gap distance of the recording layer; and numeral 303 indicates a low-pass filter for extracting surface irregularity components of the recording layer. Numeral 304 indicates an error amplifier for detecting an 20 error between a reference voltage $V_{REF}$ and the low-pass filter 303; and numeral 305 indicates a driver for driving the actuator 204. Numeral 306 indicates a drive circuit for performing position control of the XY stage. Numeral 307 indicates a high-pass filter for separating data components.

Any signals of a frequency component not higher than $f_0$ are due to a gentle rise and fall of the substrate 101 due to warp, distortion or the like. Symbol $f_2$ indicates a recording data carrier component, and numeral 403 indicates a data signal band. Symbol $f_3$ indicates a signal component generated from the atomic/molecular arrangement of the recording layer, and symbol $f_T$ indicates a tracking signal. A signal around $f_1$ is due to a slight irregularity of the surface of the electrode layer 102, i.e., the (111) surface. This irregularity is made equal to or smaller than the recording signal. In recording and reproduction utilizing the STM, the change in this irregularity approximately corresponds to five layers of electrode materials (1 nm or less). Further, with a recording medium according to the present invention, the size of the smooth surface of the surface of the recording layer 103 is 1 μm square. Under a more favorable condition, 10 μm or more. This provides the following advantages:

① The signal component $f_1$ due to the surface irregularities of the recording layer 103 and the data signal component 403 do not overlap each other, and there is no deterioration in S/N ratio due to the expansion of the $f_1$ spectrum. That is, it is possible to reduce the incidence of error in data reading.

② It is possible to place the tracking signal $f_T$ in the vicinity of the data signal component 403. That is, the tracking frequency can be made high, thereby making it possible to ensure a satisfactory accuracy in tracking.

③ Further, because of the high tracking frequency, a configuration approximately the same as the data bit size suffices when forming a groove for tracking on the recording medium, thus making it possible to effect tracking without sacrificing the recording density.

④ Also, since there is no irregularity on the surface of the recording layer 103, the amount of displacement in the Z-axis direction is small when performing XY scanning while keeping the distance between the surface of the recording layer 103 and the probe electrode 202 constant. This makes it possible to drive the XY stage 201 at a very high speed. As a result, it is possible to perform high-speed reading and writing of data.

⑤ Since there is no irregularity on the electrode substrate, the position of the tip of the probe electrode, that is, the position of the tip atom through which the tunnel current flows, can be selected to attain stability. A phenomenon in which a tunnel current flows between a plurality of atoms of the probe electrode and the recording layer as in the case of an electrode substrate having an irregularity, i.e., the so-called ghost phenomenon, does not occur, thus enabling a highly reliable reading.

EXAMPLES

Example 1

An iodine solution was prepared by dissolving 4 g of potassium iodide (KI) and 0.6 g of iodine ($I_2$) in 50 ml of pure water. Then, a 5000 Å thick gold film formed by vacuum evaporation (approximately 0.08 g in terms of weight) was completely dissolved in the iodine solution to obtain a gold/iodine-complex stock solution. 10 ml of this stock solution was pipetted and diluted in 50 ml of pure water to prepare a reaction mother liquor. A silicon substrate whose natural oxide film had been etched by hydrofluoric acid was immersed in the mother liquor and heated to 80° C. on a hot plate. When, as a result of sublimation of the iodine, the solution had become a transparent thin-yellow color, a flat gold crystal was separated. Upon observation with an optical microscope, a flat crystal was observed all over the substrate. Upon measurement, the plane orientation dispersion angle of this electrode substrate was found to be 0.9°. Next, upon observation of the surface of the flat gold crystal with an STM, it was found that the maximum surface irregularity and dispersion peak in a 10 μm square of this substrate were 0.8 nm and 0.4 nm, respectively.

Subsequently, a track 104 having a width of 0.1 μm, a pitch of 1.0 μm, and a depth of 50 Å was formed on the surface of the flat gold crystal electrode by a focused ion beam. The focused ion beam process was conducted by using gold ions under the following conditions: acceleration voltage: 40 KV; ion current: 14 pA; dose amount: $1.0 \times 10^{16}/cm^2$.

A four-layered polyimide LB film was formed on the smooth electrode substrate, prepared in the above-described manner, as the recording layer 103. The recording layer 103 was formed by using the polyimide LB film as follows.

A polyamide acid as shown in formula (1) was dissolved in an N,N'-dimethylacetamide/benzene mixture solution of 1:1 (V/V) (density in terms of monomer: $1 \times 10^{-3}$M). Then, it was mixed with a separately prepared $1 \times 10^{-3}$M solution of N,N'-dimethyloctadecylamine in the same solvent in a proportion of 1:2 (V/V) to prepare a polyamide-acid-octadecylamine salt solution as shown in formula (2).

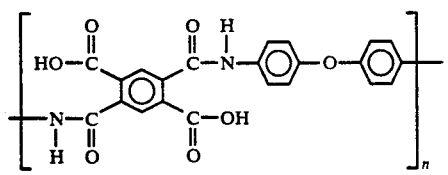

Formula (1)

$H_3C(CH_2)_{15}-N^+H(CH_3)_2$

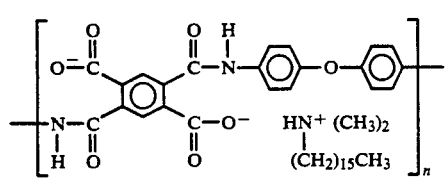

Formula (2)

This solution was developed on a water phase consisting of pure water at a temperature of 20° C. to form a monomolecular film on the surface of the water. After removing the solvent by evaporation, the surface pressure was augmented to 25 mN/m. While keeping the surface pressure constant, the above substrate electrode was gently immersed in such a way as to traverse the water surface at a rate of 5 mm/min, and was then pulled up gently at a rate of 5 nm/min to prepare a two-layered Y-type monomolecular built-up film. By repeating this operation, a four-layered monomolecular built-up film of polyamide-acid-octadecylamine salt was formed. Subsequently, this substrate was calcinated by heating for thirty minutes at 200° C. under a reduced pressure (~1 mmHg) to imidize the polyamide-acid-octadecylamine salt (Formula 3), thereby obtaining a four-layered polyimide monomolecular built-up film.

$H_3C(CH_2)_{15}-N^+H(CH_3)_2$

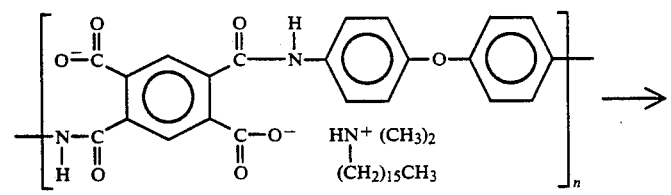

Formula (3)

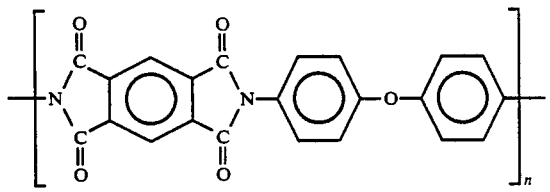

Subsequently, the surface configuration of a recording medium prepared in the above-described manner was examined on the information processing apparatus shown in FIG. 7. Upon examination, it was found that the surface of the recording medium reflected the smoothness of the electrode and the track 104. In a 10 μm square, the track 104 had been formed to a depth of 50 Å, and, outside the track 104, the maximum surface irregularity was 0.9 nm, with the dispersion peak being 0.4 nm. Accordingly, the track 104 could be clearly distinguished.

Next, a recording/reproduction experiment was conducted. A platinum/rhodium probe electrode 202 was used as the probe electrode 202. The probe electrode 202 is used for the purpose of controlling the distance (Z) between it and the recording layer 103, and is under a fine current control to a constant level. Further, the linear actuators 204, 205 and 206 are designed such that they allow fine control also in the in-plane (X, Y) directions while keeping the distance Z constant.

Further, the probe electrode 202 is capable of directly effecting recording, reproduction and erasing. Additionally, the recording medium is placed on the high-precision XY stage 201 and can be moved to an arbitrary position.

The recording layer 103, comprising a four-layered polyimide film as described above, was placed on the XY stage 201. Then, a voltage of +1.5V was applied between the probe electrode 202 and the electrode layer 102 of the recording medium, and the distance (Z) between the probe electrode 202 and the surface of the recording layer 103 was adjusted while monitoring the current. At this time, a probe current Ip for controlling the distance Z between the probe electrode 202 and the surface of the recording medium was set in such a way that $10^{-10}A \leq Ip \leq 10^{-11}A$.

Subsequently, information recording was conducted at a pitch of 100 Å while performing scanning with the probe electrode 202. In conducting the information recording, the probe electrode 202 was positioned on the + side and the electrode layer 102 on the − side, applying a rectangular pulse voltage beyond a threshold voltage $V_{th}ON$ causing the electric memory material (the four-layered polyimide film) to be changed to a low-resistance condition (ON condition). Afterwards, the probe electrode 202 was brought back to the recording start point, and was caused to scan the recording layer 103 again. Here, adjustment was made in such a way that Z was constant at the time of reading of the recorded information. As a result, it was shown that in the recording bit, a probe current of approximately 10 nA flowed, under the ON condition.

Further, the probe voltage was set at 10V which is above the threshold voltage $V_{th}OFF$ causing the electric memory material to change from the ON to the OFF condition. The recording position was traced again to confirm that this caused the entire recording conditions to be erased, thereby causing the material to be changed to the OFF condition.

Still further, a recording pulse was applied in accordance with the above recording method to a position which was in the OFF condition with the recording condition erased to confirm that it caused the material to be changed to the OFF condition. It was also confirmed that the recording condition could be erased again.

Example 2

Using the mother liquor described in Example 1, electrode layers were formed on different types of substrates, and an experiment similar to that of Example 1 was conducted thereon. Table 1 shows the surface properties of the electrode layers used in the experiment.

TABLE 1

| Substrate type | Dispersion angle | Maximum surface irregularity | Dispersion peak |
|---|---|---|---|
| Si (etched) | 0.9° | 0.8 nm | 0.4 nm |
| HOPG | 0.6° | 0.7 nm | 0.3 nm |
| Au/Si | 0.9° | 0.8 nm | 0.4 nm |
| Cr/Si | 0.9° | 0.8 nm | 0.4 nm |
| Al/Si | 0.9° | 0.9 nm | 0.4 nm |
| a-Si/SiO$_2$ (thermal oxidation film) | 0.9° | 0.9 nm | 0.4 nm |
| Glass | 1.0° | 1.0 nm | 0.4 nm |
| SiO$_2$/Si (thermal oxidation film) | 0.9° | 0.8 nm | 0.4 nm |
| SiN/Si | 1.0° | 0.9 nm | 0.4 nm |
| MgO | 0.6° | 1.0 nm | 0.4 nm |
| Polyimide (capton) | 1.0° | 1.1 nm | 0.4 nm |

Surface irregularity (in 10 μm square)

Recording mediums prepared by using the electrode substrates of Table 1 were examined for surface configuration on the information processing apparatus shown in FIG. 7. The surface of each recording medium reflected the smoothness of the electrode and the track 104. In a 10 μm square, the track 104 had been formed 50 Å deep, and the maximum surface irregularity outside the track 104 was 0.9 nm or less, with the dispersion peak being 0.4 nm or less. Therefore, as in Example 1, the track 104 could be clearly distinguished. Next, an experiment was conducted on recording, reproduction and erasing, and it was confirmed through the experiment that recording, reproduction and erasing could be performed as in Example 1.

Example 3

A planar gold crystal like that of Example 1 was formed under the same experimental conditions as in Example 1 except that instead of taking the iodine out of the reaction system by sublimation, the iodine was reduced by using reducing agents. The smoothness of this crystal, too, was substantially the same as that of Example 1, The reducing agents used in the experiment were sulfite ions and hydroquinone. The substrate was a silicon substrate and the crystallization temperature was 60° C.

Example 4

An experiment was conducted in which the gold concentration of the stock solution of Example 1 and the crystallization temperature were varied. The results are summarized in Table 2. The substrate used was a silicon crystal substrate.

TABLE 2

| Amount of gold dissolved (g) | Crystallization temperature (°C.) | Average facet diameter | Dispersion angle | Average maximum surface irregularity (10 μm square) |
|---|---|---|---|---|
| 0.08 | 70 | 300 μm | 0.6° | 0.9 nm or less |
| 0.08 | 75 | 200 μm | 0.6° | 0.9 nm or less |
| 0.1 | 65 | 350 μm | 0.6° | 0.9 nm or less |
| 0.1 | 70 | 300 μm | 0.6° | 0.9 nm or less |
| 0.1 | 80 | 150 μm | 0.8° | 0.9 nm or less |
| 0.12 | 65 | 500 μm | 0.5° | 0.9 nm or less |
| 0.12 | 70 | 350 μm | 0.6° | 0.9 nm or less |
| 0.12 | 75 | 200 μm | 0.6° | 0.9 nm or less |
| 0.17 | 65 | 600 μm | 0.4° | 0.9 nm or less |
| 0.17 | 70 | 450 μm | 0.5° | 0.9 nm or less |
| 0.17 | 75 | 200 μm | 0.7° | 0.9 nm or less |

Example 5

A silicon substrate and a glass (SiO$_2$) substrate which had been surface-processed by various well-known methods in such a manner that the matrix intersections at intervals of 500 μm were made 1 μm to 2 μm square were immersed in the mother liquor used in Example 1 to observe how crystallization took place under the same conditions as in Example 1.

Each of the seed substrates for selective deposition used in the experiment was prepared in the following manner:

① A silicon substrate having a thermal oxidation film (having a thickness of 500 to 1000 Å) was prepared and the thermal oxidation film was etched by HF by using AZ1370 (manufactured by Hoechst) as a photoresist to form a seed pattern.

② A 1000 Å thick silicon nitride film was formed by the low-pressure CVD method on the silicon substrate from which the surface natural-oxidation film had been removed by etching. Then, a CF$_4$ reactive ion etching was performed thereon by using AZ1370 as a photoresist to form a seed pattern.

③ A 100 Å thick photosensitive polyimide LB film was formed on the silicon substrate from which the natural-oxidation film had been removed by etching, and an etching pattern was formed thereon as a seed pattern.

④ A resist pattern of AZ1370 was formed on the silicon substrate from which the surface natural-oxidation film had been removed by etching. Then, gold was deposited to a depth of 100 Å by resistance heating vacuum evaporation, with a 30 Å thick chromium film being used as an under-coat layer, to form a seed pattern through lift-off.

⑤ Using a silicon substrate having a 1000 Å thick thermal oxidation film, a seed pattern was formed in the same way as in ④.

⑥ An amorphous silicon film was formed to a thickness of 1000 Å by the GD method on a well-cleaned coning #7059 glass substrate. Etching was performed thereon by CF$_4$ reactive ion etching by using AZ1370 as a photoresist to form a seed pattern.

⑦ A seed pattern was formed on the silicon substrate by ion implantation of Au$^{++}$ ions accelerated at 40 kV, using JIBL-100A (manufactured by Nippon Denshi) as the FIB apparatus, under the following conditions:

ion current value: 30 pA; and
ion implantation amount: $1 \times 10^{15}$ ions/cm$^2$.

The results of the experiment on the seed substrates are summarized in Table 3.

TABLE 3

| | Surface configuration & material | Crystallization |
|---|---|---|
| FIG. 11(a) | SiO$_2$/Si | Selective deposition observed |
| | SiN/Si | Selective deposition observed Slight crystal growth observed on a part of SiN surface |
| | Polyimide/Si | Selective deposition observed |
| FIG. 11(b) | Au(/Cr)/Si | Selective deposition observed Very slight crystal growth also observed on Si surface |
| | Au(/Cr)/SiO$_2$ | Selective deposition observed |
| | a-Si/SiO$_2$ | Selective deposition observed |
| FIG. 11(c) | Si substrate | Selective deposition observed |
| | Au-ion-beam-processed | Very slight growth also observed on Si surface |

Next, as in Example 1, four layers of polyimide monomolecular films were accumulated on an electrode substrate prepared by the method ⑤ to form a recording medium, which was examined for surface configuration on the information processing apparatus shown in FIG. 7. The surface of the recording medium reflected the smoothness of the electrode, and the maximum surface irregularity in a 10 μm square was 0.9 nm or less, with the dispersion peak being 0.4 nm or less.

The planar gold crystal selectively deposited formed a (111) plane orientation facet, which was in the same pattern as the seed pattern used. Further, the edges of the facet reflected the characteristics of the crystal surface so as to provide a track of a very high degree of linearity (see FIG. 12). The track groove formed was deep, so that the track could be clearly distinguished as in Example 1.

Next, an experiment was performed on recording, reproduction and erasing, and it was confirmed that recording, reproduction and erasing could be performed as in Example 1 with an electrode substrate prepared in the above-described manner. Further, it was also confirmed that recording, reproduction and erasing could be performed with electrode substrates prepared by other methods as described above.

Example 6

1 normal sodium hydroxide was added to a commercial gold sulfite plating liquid (Newtronex 309 manufactured by Nippon Retroplating Engineers Kabushiki Kaisha) to adjust the solution to a pH of 13. Then, a silicon crystal substrate, a glass substrate, and gold and aluminum deposition substrates were separately immersed therein and observed for crystallization. Growth of a planar gold crystal was observed on the silicon crystal substrate and the aluminum deposition substrate.

It is to be assumed that regarding the substrate selectivity in this case, the formation of a local cell as a result of the dissolution of the substrate is predominant, and a material having a higher degree of ionization tendency than that of gold allows selective deposition. Therefore, a selective deposition of gold as shown in Example 6 is also possible with a combination of the selective deposition according to the method of Example 5 and the crystal growth process shown in Example 1.

Example 7

1.4 g of potassium iodide and 0.6 g of iodine I$_2$ were dissolved in 50 ml of pure water to prepare an iodine solution. Then, a 5000 Å thick gold film (about 0.08 g in terms of weight) formed by vacuum evaporation was completely dissolved in the iodine solution to prepare a gold/iodine-complex solution as a stock solution, 10 ml of which was pipetted and diluted in 50 ml of pure water to prepare a reaction mother liquor. A silicon substrate whose natural oxidation film had been etched with hydrofluoric acid was immersed in the mother liquor and was heated on a hot plate at 80° C. When the iodine had been sublimed and the solution became a transparent thin yellow, a planar gold crystal was separated. Upon examination with an optical microscope, a planar crystal was observed all over the substrate surface. Upon measurement, the plane orientation dispersion angle of this electrode substrate was 0.9°. Next, upon observation with an STM of the surface of the planar crystal, it was found that the maximum surface irregularity in a 10 μm square was 0.8 nm and the dispersion peak was 0.4 nm.

Subsequently, a track 104 having a width of 0.1 μm, a pitch of 1.0 μm and a depth of 5.0 Å was formed on the surface of the planar gold crystal electrode by a focused ion beam, using gold ions under the following conditions: acceleration voltage: 40 KV; ion current: 14 pA; and dose amount: $1.0 \times 10^{16}$/cm$^2$.

Then, using the gold electrode substrate which had been prepared by the above-described method, an examination was made to evaluate surface configuration on the information processing apparatus shown in FIG. 7. The surface of the recording medium reflected the smoothness of the electrode and the track 104, which had been formed to a depth of 50 Å in a 10 μm square, exhibiting a maximum surface irregularity of 0.9 nm and a dispersion peak of 0.4 nm. Accordingly, the track 104 could be clearly distinguished. Next, a gold wire having a diameter of 250 μm was formed into a gold chip through electrolytic polishing in concentrated hydrochloric acid (1.5 to 2 Vdc), thereby preparing a gold probe electrode 202, which was used in an experiment on recording and reproduction. The probe electrode 202 is intended for the control of the distance (Z) between it and the recording layer 103, and is under a fine current control to attain a constant level. Further, the linear actuators 204, 205 and 206 are so designed as to allow fine motion control in the in-plane directions (X, Y) while maintaining the distance Z constant.

Further, the probe electrode 202 is capable of directly performing recording, reproduction and erasing. Moreover, the recording medium is placed on the high-precision XY stage 201 and can be moved to an arbitrary position.

The above-mentioned gold substrate electrode was placed on the XY stage 201. Then, a voltage of +1.5V was applied between the probe electrode 202 and the gold substrate electrode 102, and the distance (Z) between the probe electrode 202 and the recording medium 103 was adjusted while monitoring the current. Here, a setting was made in such a manner that the probe current Ip for controlling the distance Z between the probe electrode 202 and the surface of the recording medium 103 was kept in the range: $10^{-10}$A$\geq$IP$\geq 10^{-11}$A.

Next, information recording was conducted at a pitch of 100 Å while performing scanning with the probe electrode 202 The information recording was effected by applying a rectangular pulse voltage equal to or higher than the threshold voltage V$_{th}$ON of field evaporation of gold (Usually, voltage: 4V; and width: 350 ns), with the probe electrode 202 placed on the + side and the gold substrate electrode 102 on the − side. Afterwards, the probe electrode 202 was brought back to the recording start point, and was made to scan the recording layer 103 again. Here, adjustment was made so that Z is constant at the time of information reading. As a result, it was shown that in a recording bit, a probe current of approximately 10 nA flows, with fine particles of gold being accumulated.

Example 8

A gold substrate electrode was formed in the same manner as in Example 7. A two-layered spiropyran LB film was formed on the prepared gold substrate electrode, thereby preparing the recording layer 103. In the following, a description will be given on how the recording layer 103 using the spiropyran LB film was formed.

A mixture solution of a spiropyran derivative with an octadecyl group introduced therein and arachidic acid in the proportion of 1:2 (solvent: chloroform in a concentration of $1 \times 10^{-3}$M) was developed on a water phase consisting of an aqueous solution of $CdCl_2$ (concentration: $1 \times 10^{-4}$M) at a temperature of 20° C. to form a monomolecular film on the water surface. After removing the solvent by evaporation, the surface pressure was raised up to 30 mN/m. While keeping the surface pressure constant, the above substrate electrode was gently immersed in such a way as to traverse the water surface at a rate of 5 m/min. Then, it was gently pulled up, thereby forming a two-layered Y-type monomolecular built-up film.

Next, using the recording medium prepared by the method described above, an examination for surface configuration was conducted on the information processing apparatus shown in FIG. 7. It was found that the surface of the recording medium reflected the smoothness of the electrode and the track 104, which had been formed to a depth of 50 Å in a 10 μm square, and the maximum surface irregularity outside the track 104 was 0.9 nm or less, with the dispersion peak being 0.4 nm or less. Accordingly, the track 104 could be clearly distinguished as in Example 7. Next, an experiment on recording and reproduction was conducted, and it was confirmed that recording and reproduction could be performed as in Example 7. As to the recording bit diameter, measurements ranging from approximately 10 Å to 50 Å could be ascertained (recording voltage: 3.2V; width: 350 nsec). It was found that the average bit diameter taking into account the incidence of occurrence was approximately 16 Å.

Example 9

Using the mother liquor described in Example 7, electrode layers were formed on various types of substrates, and an experiment similar to that of Example 7 was conducted. The surface properties of the electrode layers used in the experiment are summarized in Table 1 (shown above).

As shown in Table 1, the surface of each recording medium reflected the smoothness of the electrode and the track 104. In a 10 μm square, the track 104 had been formed 50 Å deep, and the maximum surface irregularity outside the tract 104 was 0.9 nm or less, with the dispersion peak being 0.4 nm or less. Therefore, as in Example 7, the track 104 could be clearly distinguished. Next, an experiment was conducted on recording, reproduction and erasing. It was confirmed that recording reproduction and erasing could be performed as in Example 7.

Further, a recording/reproduction experiment similar to that of Example 7 was performed using a spiropyran LB film as the recording layer, as in Example 8, and it was confirmed that recording and reproduction could be performed as in Example 7. Also, the average bit diameter was substantially the same value.

Example 10

A silicon substrate and a glass ($SiO_2$) substrate which had been surface-processed by various well-known methods in such a way as to make the matrix intersections at intervals of 500 μm 1 μm to 2 μm square were immersed in the mother liquor used in Example 7 to observe how crystallization occurred under the same conditions as in Example 7.

Each of the seed substrates for selective deposition used in the experiment was prepared in the following manner:

① A silicon substrate having a thermal oxidation film (having a thickness of 500 to 1000 Å) was prepared and the thermal oxidation film was etched by HF by using AZ1370 (manufactured by Hoechst as a photoresist to form a seed pattern.

② A 1000 Å thick silicon nitride film was formed by the low-pressure CVD method on the silicon substrate from which the surface natural-oxidation film had been removed by etching. Then, a $CF_4$ reactive ion etching was performed thereon by using AZ1370 as a photoresist to form a seed pattern.

③ A 100 Å Thick photosensitive polyimide LB film was formed on the silicon substrate from which the natural-oxidation film had been removed by etching, and an etching pattern was formed thereon as a seed pattern.

④ A resist pattern of AZ1370 was formed on the silicon substrate from which the surface natural-oxidation film had been removed by etching. Then, gold was deposited to a depth of 100 Å by resistance heating vacuum evaporation, with chromium being used in the form of a 30 Å thick under-coat layer, to form a seed pattern through lift-off.

⑤ Using a silicon substrate having a 1000 Å thick thermal oxidation film, a seed pattern was formed in the same way as in ④.

⑥ An amorphous silicon film was formed to a thickness of 1000 Å by the GD method on a well-cleaned coning #7059 glass substrate. Etching was performed thereon by $CF_4$ reactive ion etching using AZ1370 as a photoresist so as to form a seed pattern.

⑦ A seed pattern was formed on the silicon substrate by ion implantation of $Au^{++}$ions accelerated at 40 kV, using JIBL-100A (manufactured by Nippon Denshi) as the FIB apparatus, under the following conditions:

ion current value: 30 pA; and
ion implantation amount: $1 \times 10^{15}$ ions/cm².

The results of the experiment on the seed substrates are summarized in Table 3 (shown above).

Next, an electrode substrate prepared by the method ⑤ was examined for surface configuration on the information processing apparatus shown in FIG. 7. The maximum surface irregularity in a 10 μm square was 0.9 nm or less, with the dispersion peak being 0.4 nm or less.

It was found that the edges of the facet of the planar gold crystal selectively deposited reflected the characteristics of the crystal surface so as to provide a track of a very high degree of linearity. The track groove formed was deep, so that the track could be clearly distinguished as in Example 7.

Next, an experiment was performed on recording, reproduction and erasing, and it was confirmed that recording, reproduction and erasing could be performed as in Example 7. Further, it was also confirmed that recording, reproduction and erasing could be performed with electrode substrates prepared by other methods as described above.

As described above, the present invention provides the following advantages: ①  It is possible to form a recording medium having a smooth surface of a surface irregularity of 1 nm in a 1 $\mu$m square and, further, in a 10 $\mu$m square.

② Since a smooth electrode can be formed without depending upon the substrate material, adaptation is possible in a recording medium to any system. Further, it can be used not only as a recording medium but also as an electrode substrate for an electronic device.

In the case, for example, of a recording medium, an electrode substrate according to the present invention is formed by using an Si chip as a substrate which is prepared by incorporating therein a writing/reading control circuit, whereby it is possible to provide a memory medium comprising a writing/reading control circuit and a recording medium, which are formed as one integral unit.

Further, it is also possible to make use of the latest micromechanics technique to incorporate a drive actuator onto an Si chip and provide an electrode layer according to the present invention on this actuator, thereby realizing a recording medium equipped with a fine motion control mechanism. Such an application of the present invention is not restricted to recording mediums. It is naturally also applicable with respect to various types of devices, such as sensors, memories, and displays.

③ The crystal surface of the gold electrode forms a clear facet. The lines of intersection on the crystal surface are straight lines which are uniform in the atomic order, so that when using the gold electrode for a recording medium, the lines of intersection can be used as tracks, and, by virtue of their uniformity of the atomic order, an improvement can be achieved in terms of controllability in recording and reproduction.

④ The electrode substrate producing method of the present invention utilizes differences in substrate material and configuration effect with respect to the gold crystallization characteristics so as to provide an advantage that a planar gold crystal can be formed at a desired position on a substrate. Further, in the case of a reproducing apparatus having a probe electrode as used in the present invention, such a selective deposition control makes it possible to form, for example, an independent smooth electrode corresponding to each individual probe electrode, to meet the recent tendency toward multiple probes, thus providing, combined with the effect described in ③, a superiority in the preparation of recording mediums.

⑤ Further, by using such a recording medium, it is possible to reduce the incidence of error in data reading. In addition, an improvement can be achieved in terms of tracing accuracy in tracking, thus enabling high-speed reproduction.

⑥ It is possible to record through changes including configuration changes in one molecule or changes in surface configuration of several atoms, so that high-density recording with recording bits on a molecular scale can be performed.

While the present invention has been described with respect to what is presently considered to be the preferred embodiments, it is to be understood that the invention is not limited to the disclosed embodiments. The present invention is intended to cover the various modifications and equivalent arrangements included within the spirit and scope of the appended claims.

What is claimed is:

1. An electrode substrate comprising a substrate and at least one noble metal planar crystal formed on said substrate as an electrode layer wherein said noble metal planar crystal is made of a single crystal having an electrode surface forming at least a facet of (111) plane orientation and a boundary of said single crystal surface is substantially linear.

2. An electrode substrate according to claim 1, wherein said substrate comprises a noble metal electrode thin film made of said planar crystal having a plane orientation dispersion angle measuring 1° or less by ray analysis.

3. An electrode substrate according to claim 1, wherein said noble metal crystal has an aspect ratio of at least 10.

4. An electrode substrate according to claim 1, wherein said substrate comprises a conductive substrate and an insulating layer formed on said conductive substrate.

5. An electrode substrate according to claim 4, wherein said insulating layer has a through-hole communicating with said conductive substrate, wherein said noble metal crystal is produced by crystal growth from said conductive substrate through said through-hole.

6. An electrode substrate according to claim 1 or 2, wherein said planar crystal has a crystal surface exhibiting a plane-orientation dispersion angle of no more than about 0.6°.

7. An electrode substrate according to claim 1, wherein a maximum surface irregularity in an in-plane area of $1\mu m \times 1\mu m$ of said electrode layer is not more than about 1nm.

8. An electrode substrate according to one of claims 1-5 employed in a recording medium, said electrode layer being a recording layer.

9. An information recording medium comprising a substrate, at least one noble metal planar crystal formed on said substrate, as an electrode layer and a recording layer provided on said electrode layer, wherein said noble metal planar crystal is made of a single crystal having an electrode surface forming at least a facet of (111) plane orientation and a boundary of said single crystal surface is substantially linear.

10. An information recording medium according to claim 9, wherein said substrate comprises a noble metal electrode thin film made of said planar crystal having a plane orientation dispersion angle measuring 1° or less by X-ray analysis.

11. An information recording medium according to claim 9, wherein said noble metal crystal has an aspect ratio of at least 10.

12. An information recording medium according to claim 9, wherein said said substrate comprises a conductive substrate and a insulating layer formed on said conductive substrate.

13. An information recording medium according to claim 12, wherein said insulating layer has a through-hole communicating with said conductive substrate, wherein said noble metal crystal is produced by crystal growth from said conductive substrate through said through-hole.

14. An information recording medium according to claim 9, wherein said planar crystal has a crystal surface exhibiting a plane-orientation dispersion angle of no more than about 0.6°.

15. An information recording medium according to claim 9, wherein a maximum surface irregularity in an in-plane area of 1μm × 1μm of said electrode layer is not more than about 1nm.

16. An information recording medium according to claim 9, wherein said recording layer comprises at least one layer of a monomolecular film of an organic compound.

17. An information recording medium according to claim 9, wherein said recording layer has a thickness of between about 5 to about 300 Å.

18. An information recording medium according to claim 9, wherein said recording layer records information as changes in physical conditions.

19. An information recording medium according to claim 9, wherein said recording layer has a memory effect.

20. An information recording medium according to claim 9, further comprising a track.

21. An information processing apparatus comprising:
an information recording medium, said information recording medium comprising a substrate, at least one noble metal planar crystal formed on said substrate, as an electrode layer, and a recording layer provided on said electrode layer, wherein said noble metal planar crystal is made of a single crystal having an electrode surface forming at least a facet of (111) plane orientation and a boundary of said single crystal surface is substantially linear;
a probe electrode disposed in close proximity to said medium;
a first voltage applying circuit for applying a pulse voltage between said medium and said probe electrode;
a second voltage applying circuit for applying a bias voltage between said medium and said probe electrode; wherein
information is written onto said medium by an application of said pulse voltage and said information is readable from said medium by an application of said bias voltage.

22. An information recording medium according to claim 21, wherein said recording layer comprises at least one layer of a monomolecular film of an organic compound.

23. An information processing apparatus according to claim 21, wherein said recording layer has a thickness of between about 5 to about 300 Å.

24. An information processing apparatus according to claim 21, wherein said information is written on said recording layer in accordance with physical conditions.

25. An information processing apparatus according to claim 21, wherein said recording layer has memory effect.

26. An information processing apparatus according to claim 21, further comprising a track.

27. An information processing apparatus comprising:
an information recording medium, said information recording medium comprising a substrate, an electrode layer of a noble metal crystal joined on said substrate, and a recording layer provided on said electrode layer, said noble metal crystal exhibiting a substantially linear domain boundary and a plane orientation dispersion angle measured by X-ray analysis of no more than about 1°;
a probe electrode disposed in close proximity to said medium;
a first voltage applying circuit for applying a pulse voltage between said medium and said probe electrode;
a second voltage applying circuit for applying a bias voltage between said medium and said probe electrode; wherein
information is written onto said medium by an application of said pulse voltage and said information is readable from said medium by an application of said bias voltage.

28. An information processing apparatus according to claim 21, further comprising a plurality of said probe electrodes.

29. An information processing method comprising the steps of:
providing an information recording medium, comprising a substrate, at least one noble metal planar crystal formed on said substrate as an electrode layer and a recording layer provided on said electrode layer, wherein said noble planar metal crystal is made of a single crystal having an electrode surface forming at least a facet of (111) plane orientation and a boundary of said single crystal surface is substantially linear, said recording layer consisting of at least one layer of monomolecular film of an organic compound, wherein said recording layer has a thickness ranging from about 5 to about 300 Å, has a memory effect, and further comprises a track;
arranging a probe electrode in close proximity to said medium;
applying a pulse voltage between said medium and said probe electrode, thereby recording an information by imparting a perturbation to a surface of said medium by selectively generating disturbance; and applying a bias voltage between said medium and said probe electrode to read the information of said medium.

30. An information processing method according to claim 29, further comprising the steps of:
providing said information recording medium on which said information has been recorded beforehand;
arranging a probe electrode in close proximity to said medium; and
applying a bias voltage between said medium and said probe electrode so as to read the information from said medium.

31. An information processing apparatus according to claim 21, wherein said substrate comprises a noble metal electrode thin film made of said planar crystal having a plane orientation dispersion angle measuring 1° or less by X-ray analysis.

32. An information processing method according to claim 29, wherein said substrate comprises a noble metal electrode thin film made of said planar crystal having a plane orientation dispersion angle measuring 1° or less by X-ray analysis.

* * * * *

UNITED STATES PATENT AND TRADEMARK OFFICE
CERTIFICATE OF CORRECTION

PATENT NO. : 5,329,514
DATED : July 12, 1994
INVENTOR(S) : KEN EGUCHI, ET AL.

It is certified that error appears in the above-identified patent and that said Letters Patent is hereby corrected as shown below:

ON TITLE PAGE

In [56] References Cited, under OTHER PUBLICATIONS:
"No.," should read --No. 1,--.

COLUMN 5

Line 37, "an" should read --a--.

COLUMN 10

Line 64, "10 thick" should read --1φ thick--.

COLUMN 13

Line 27, "5 nm/min" should read --5 mm/min--.

COLUMN 18

Line 64, "electrode 202" should read --electrode 202.--.

COLUMN 19

Line 64, "tract 104" should read --track 104--.

COLUMN 21

Line 12, "advantages:" should read --advantages: ¶--.

COLUMN 22

Line 13, "layer" should read --layer,--.
Line 48, "substrate," should read --substrate-- and "layer" should read --layer,--.

UNITED STATES PATENT AND TRADEMARK OFFICE
CERTIFICATE OF CORRECTION

PATENT NO. : 5,329,514
DATED : July 12, 1994
INVENTOR(S) : KEN EGUCHI, ET AL.

It is certified that error appears in the above-identified patent and that said Letters Patent is hereby corrected as shown below:

<u>COLUMN 22</u>

Line 63, "said said" should read --said--.
    Line 64, "a" should read --an--.

<u>COLUMN 23</u>

Line 31, "strate," should read --strate--.
    Line 49, "recording medium" should read --processing apparatus--.

<u>COLUMN 24</u>

Line 26, "layer" (first occurrence) should read --layer,--.
    Line 42, "generating" should read --generating a--.
    Line 43, "and" should read --and ¶ --.

Signed and Sealed this

Seventh Day of February, 1995

Attest:

BRUCE LEHMAN

Attesting Officer      *Commissioner of Patents and Trademarks*